(12) United States Patent
Henley et al.

(10) Patent No.: US 7,390,724 B2
(45) Date of Patent: Jun. 24, 2008

(54) METHOD AND SYSTEM FOR LATTICE SPACE ENGINEERING

(75) Inventors: Francois J. Henley, Aptos, CA (US);
Philip James Ong, Milpitas, CA (US);
Igor J. Malik, Palo Alto, CA (US)

(73) Assignee: Silicon Genesis Corporation, San Jose, CA (US)

( * ) Notice: Subject to any disclaimer, the term of this patent is extended or adjusted under 35 U.S.C. 154(b) by 268 days.

(21) Appl. No.: 11/104,298

(22) Filed: Apr. 11, 2005

(65) Prior Publication Data

US 2005/0233545 A1  Oct. 20, 2005

Related U.S. Application Data

(60) Provisional application No. 60/615,070, filed on Oct. 1, 2004, provisional application No. 60/579,756, filed on Jun. 14, 2004, provisional application No. 60/561,762, filed on Apr. 12, 2004.

(51) Int. Cl.
*H01L 21/30* (2006.01)
*H01L 21/46* (2006.01)

(52) U.S. Cl. .............................. 438/455; 257/E21.567

(58) Field of Classification Search ................ 438/455; 257/E21.567, E21.561, E21.088
See application file for complete search history.

(56) References Cited

U.S. PATENT DOCUMENTS

| | | | |
|---|---|---|---|
| 3,392,069 A | 7/1968 | Merkel et al. | |
| 5,374,564 A | 12/1994 | Bruel | |
| 5,793,913 A | 8/1998 | Kovacic | |
| 6,013,563 A | 1/2000 | Henley et al. | |
| 6,020,252 A | 2/2000 | Aspar et al. | |
| 6,151,824 A | * 11/2000 | Clayton | 42/54 |
| 6,287,941 B1 | 9/2001 | Kang et al. | |
| 6,291,321 B1 | 9/2001 | Fitzgerald | |

(Continued)

FOREIGN PATENT DOCUMENTS

EP    1085562 A2    3/2001

(Continued)

OTHER PUBLICATIONS

Adam et al., SOI as a Mainstream IC Technology, Proceedings 1998 IEEE International SOI Conference, Oct. 1998, pp. 9-12.

(Continued)

*Primary Examiner*—David A Zarneke
(74) *Attorney, Agent, or Firm*—Townsend and Townsend and Crew LLP

(57) ABSTRACT

A system for manufacturing multilayered substrates. The system has a support member is adapted to process a film of material comprising a first side and a second side from a first state to a second state. The support member is attached to the first side of the film of material. The second state comprises a stressed state. The system has a handle substrate comprising a face, which is adapted to be attached to the second side of the film of material. The support member is capable of being detached from the first side of the film of material thereby leaving the handle substrate comprising the film of material in the second state being attached to the face of the handle substrate.

38 Claims, 16 Drawing Sheets

U.S. PATENT DOCUMENTS

| | | | |
|---|---|---|---|
| 6,455,397 | B1 | 9/2002 | Belford |
| 6,503,773 | B2 | 1/2003 | Fitzgerald |
| 6,514,836 | B2 | 2/2003 | Belford |
| 6,563,152 | B2 | 5/2003 | Roberts et al. |
| 6,809,009 | B2 | 10/2004 | Aspar et al. |
| 6,815,309 | B2 * | 11/2004 | Letertre et al. ............... 438/406 |
| 6,881,632 | B2 * | 4/2005 | Fitzgerald et al. ........... 438/285 |
| 2001/0039095 | A1 | 11/2001 | Marty |
| 2002/0174828 | A1 | 11/2002 | Stefanescu et al. |
| 2005/0118754 | A1 | 6/2005 | Henley et al. |

FOREIGN PATENT DOCUMENTS

| | | |
|---|---|---|
| WO | WO 00/63965 | 10/2000 |
| WO | WO 01/54175 | 7/2001 |

OTHER PUBLICATIONS

Belford et al., Performance-Augmented CMOS Using Back-end Uniaxial Strain, 2002 Device Research Conference, Santa Barbara, CA.

Comita et al., Low Temperature Si and SiGe Epitaxy for sub 01.µm Technology, AMAT Conference Paper, Mar. 10, 2003.

Chuang et al., Design Considerations of SOI Digital CMOS VLSI, Proceedings 1998 IEEE International SOI Conference, Oct. 1998, pp. 5-8.

Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.

Ge et al., Process-Strained Si (PSS) CMOS Technology Featuring 3D Strain Engineering, IEEE International Electron Devices Meeting, Washington, DC, Dec. 2003.

Hobuka et al., Change in Micro roughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.

Mantl et al., Enhanced Strain Relaxation of Epitomical SiGe-Layers ON Si (100) Improved by Hydrogen Implantation, Nuclear Instruments and Methods in Physics Research Section B, Jan. 1999, v. 147, Issue 1-4, p. 29-34.

Onjima et al., Lattice Relaxation Process of A1N Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.

QE's Smooth Approach Increases Carrier Mobilities, News, www.compoundsemiconductor.net, Dec. 2004.

Saenger, et al., Amorphization/templated recrystallization Method for Changing the Orientation of Single-Crystal Silicon: An Alternative Approach to Hybrid Orientation Substrates, Appl. Phys. Lett. 87, 221911, 2005.

Thomspson, Strained Silicon MOSFETs: The Next Material Change to Extend Moore's Law, University of Florida, Spring MRS 2004.

Yaguchi et al., Strain Relaxation in MBE-Grown SI1-SGEX/SU (100) Heterostructures by Annealing, Japanese Journal of Applied Physics, Tokyo, JP, v. 30, No. 8B Part 2, Aug. 1991, pp. L1450-L1453.

Yang et al., On the Integration of CMOS with Hybrid Crystal Orientations, 2004 Symposium on VLSI Technology Digest of Technical Papers, 2004.

Yang et al., High Performance CMOS Fabricated on Hybrid Substrate with Different Crystal Orientations, IEDM Tech. Dig., 2003, pp. 453-456.

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

\* cited by examiner

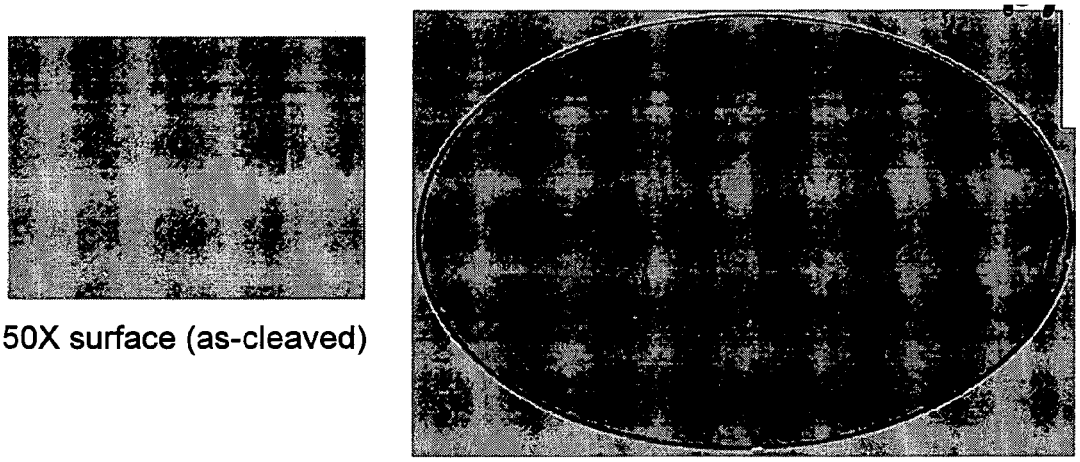
50X surface (as-cleaved)
As-cleaved s-SOI substrate
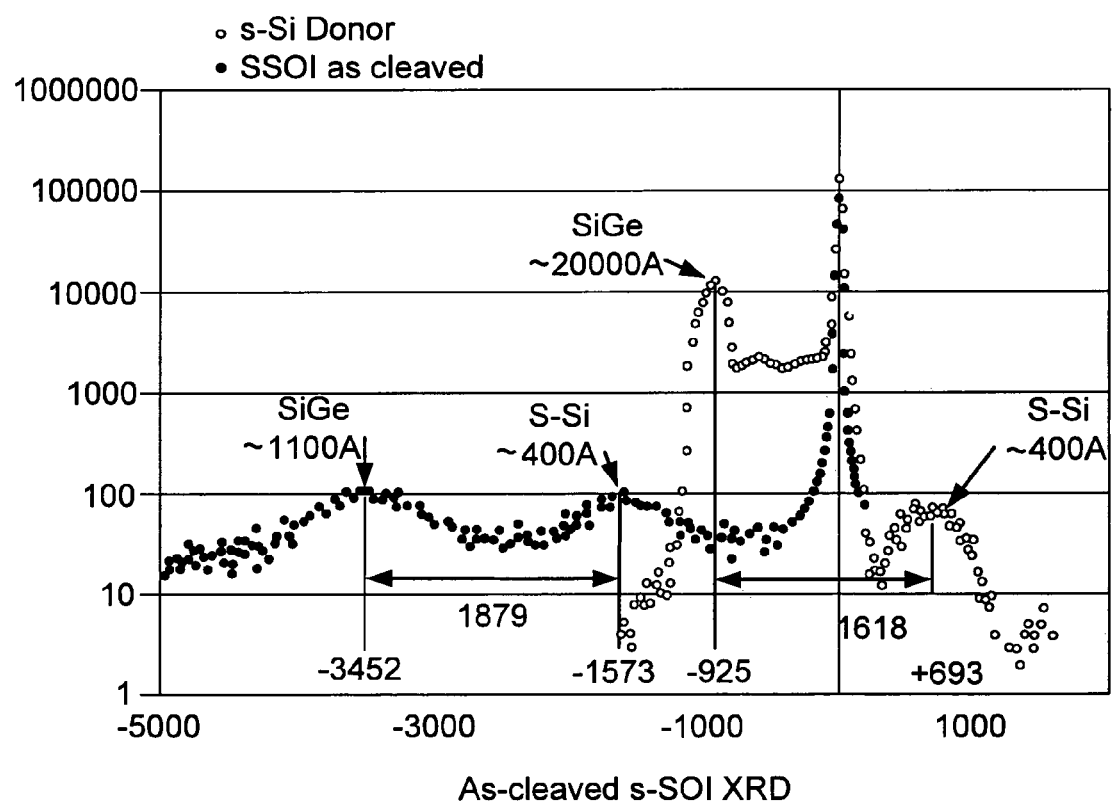
As-cleaved s-SOI XRD
FIG. 20

METHOD AND SYSTEM FOR LATTICE
SPACE ENGINEERING

CROSS-REFERENCE TO RELATED
APPLICATIONS

The present application claims priority to U.S. Provisional Application Nos. 60/561,762; 60/579,756 and 60/615,070, filed Apr. 12, 2004; Jun. 14, 2004 and Oct. 1, 2004, commonly assigned, and hereby incorporated by reference herein.

BACKGROUND OF THE INVENTION

The present invention is directed to integrated circuits and their processing for the manufacture of semiconductor devices. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of such devices on conventional bulk silicon. Conventional bulk silicon has been used for numerous years. As devices become smaller, however, conventional bulk silicon has limitations. These limitations include isolation problems between transistor device structures. Additionally, conventional bulk silicon has imperfections, which lead to limitations with device speed and reliability issues. These and other limitations will be described in further detail throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

In a specific embodiment, the invention provides a method for fabricating multi-layered substrates, e.g., silicon on insulator, strained silicon on silicon. The method includes providing a donor substrate (e.g., silicon wafer) comprising an overlying film of transfer material. The film of transfer material is characterized in a first state and having a face region. The method includes coupling the film of transfer material to a support member. The method also includes attaching the face region of the film of transfer material to the support member. The method removes the donor substrate from the film of material to expose a backside region and free the film of transfer material from the donor substrate while the film of transfer material remains affixed to the support member. The method processes the film of material using the support member from the first state to a second state, which is characterized as a stressed state. The method attaches the backside region of the film of material in the second state, while being affixed to the support member, to a handle substrate. The method releases the support member from the film of transfer material to provide the handle substrate with an overlying film of transfer material.

In an alternative specific embodiment, the invention provides a system for manufacturing multilayered substrates. The system has a support member adapted to process a film of material, comprising a first side and a second side, from a first state to a second state. The support member is attached to the first side of the film of material. The second state comprises a stressed state, e.g., strained state. The system has a handle substrate comprising a face, which is adapted to be attached to the second side of the film of material. The support member is capable of being detached from the first side of the film of material thereby leaving the handle substrate comprising the film of material in the second state being attached to the face of the handle substrate.

In yet an alternative specific embodiment, the invention provides a method for fabricating multi-layered substrates. The method includes providing a donor substrate comprising an overlying film of material characterized in a relaxed state. The method includes coupling the film of material to a support member and attaching the face region of the film of material to the support member. The method releases the donor substrate from the film of material to expose a backside region and free the film of material from the donor substrate while the film of material remains affixed to the support member. The method expands the film of material using the support member from the first state that is characterized by the relaxed state to a second state, which is characterized as a stressed state. The method attaches the backside region of the film of material in the second state, while being affixed to the support member, to a handle substrate. The support member is released from the film of transfer material in the second state to provide the handle substrate comprising the film of material in the stressed state. The method includes processing one or more regions on the film of material in the stressed state.

In a specific embodiment, the present invention provides a method for fabricating multi-layered substrates, e.g., stained silicon on substrate. The method includes providing a donor substrate comprising a thickness of a film of transfer material. In a specific embodiment, the film of transfer material is characterized in a first state and having a face region. The method includes temporarily affixing the face region of the film of transfer material to a support member and removing the donor substrate from the film of material to expose a backside region and free the film of transfer material from the donor substrate while the face region of the film of transfer material remains temporarily affixed to the support member. In a specific embodiment, the method includes processing the film of material using the support member from the first state to a second state, which is characterized as a stressed state. The method includes attaching the backside region of the film of material in the second state, while being affixed to the support member, to a handle substrate. The method releases the support member from the film of transfer material to provide the handle substrate with an overlying film of transfer material.

In a specific embodiment, the present invention provides a cluster tool system for forming strained substrates. The system includes at least a handling chamber coupled to a robot arm and a strain developing chamber coupled to the robot arm. In a preferred embodiment, the strain developing chamber has a strain developing substrate. The strain developing substrate is adapted to form strain in a thickness of material using the strain developing substrate coupled to the thickness of material.

Many benefits are achieved by way of the present invention over conventional techniques. For example, the present technique provides an easy to use process that relies upon conventional technology. In some embodiments, the method may provide higher device yields in dies per wafer. Additionally, the method provides a process that is compatible with conventional process technology without substantial modifications to conventional equipment and processes. Preferably, the method provides for certain regions of silicon that strained using a novel support member. More preferably, the invention provides a resulting thin film structure, which has been strained, that is substantially free from dislocations, and other imperfections. Preferably, the invention provides for strained silicon-on-silicon structures that substantially reduces threading dislocation density (TDD) issues. Additionally, the invention provides a resulting substrate with strain that is unlikely to relax for any area size while the strain may relax for conventional strained SOI areas during subsequent integrated circuit processing, which often requires high temperatures according to a specific embodiment. Additionally, the present invention provides a resulting structure substantially free from underlying dislocation rich germanium bearing layers or other undesirable impurities that may lead to problems with device quality and/or reliability according to other embodiments. A substantially planar strained material (e.g., silicon) surface may also be achieved using certain embodiments of the present invention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 19 through 20 are experimental results according to embodiments of the present invention.

DETAILED DESCRIPTION OF THE INVENTION

According to the present invention, techniques directed to integrated circuits and their processing for the manufacture of semiconductor devices are provided. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

Figure 1:
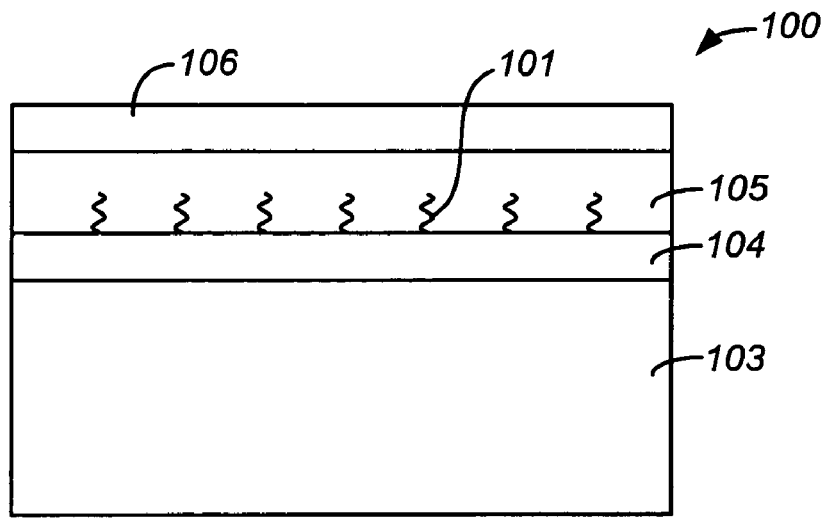
FIG. 1 is a simplified cross-sectional diagram of a conventional strained silicon substrate.

FIG. 1 is a simplified cross-sectional diagram of a conventional strained silicon substrate. As shown, the substrate 100 includes a semiconductor graded composition layer structure on the semiconductor substrate. The substrate 103 has a first semiconductor layer 104 having a series of lattice-mismatched semiconductor layers deposited on the substrate and annealed at a temperature greater than 100 degrees C. above the deposition temperature, a second semiconductor layer 105 deposited on the first semiconductor layer with a greater lattice mismatch to the substrate than the first semiconductor layer, and annealed at a temperature greater than 100 degree C. above the deposition temperature of the second semiconductor layer. An example of such a substrate is described in U.S. Pat. No. 6,503,773, in the name of Fitzgerald, which issued Jan. 7, 2003 and titled Low threading dislocation density relaxed mismatched epilayers without high temperature growth. A strained silicon epitaxial layer 106, which is subject to imperfections, can then be grown upon this underlying dislocation-rich complex.

Although there may be certain benefits to the conventional strained silicon substrate, many limitations also exist. For example, the conventional substrate has defects upon manufacture and others that may be introduced during subsequent integrated circuit processing. That is, integrated circuit process causes further defects in the strained silicon structure. We have discovered that conventional strained silicon is often characterized by a threading dislocation density 101 ranging from about $1 \times 10^4$ to $1 \times 10^6$ cm-2 threading dislocation density (TDD). Such defects have limited the use of conventional strained silicon bearing materials. Other limitations include the continued presence of the underlying lattice mismatched layers 104 and 105 that can increase the TDD levels during device processing or allow unwanted diffusion of impurities into the device strained layer 106. Accordingly, it is desired to have improved techniques for manufacturing strained silicon materials. The present invention overcomes many if not all of these limitations of conventional strained silicon substrates. Specific details of the present invention can be found throughout the present specification and more particularly below.

A method of manufacturing an integrated circuit on semiconductor substrates is briefly outlined below.

1. Provide a donor substrate, e.g., silicon wafer, comprising an overlying film of transfer material characterized in a first state and having a face region;

2. Couple the film of transfer material to a support member;

3. Attach the face region of the film of transfer material to the support member;

4. Remove the donor substrate from the film of material to expose a backside region and free the film of transfer material from the donor substrate while the film of transfer material remains affixed to the support member;

5. Process the film of material using the support member from the first state to a second state, which is characterized as a stressed state;

6. Attach the backside region of the film of material in the second state, while being affixed to the support member, to a handle substrate;

7. Release the support member from the film of transfer material;

8. Provide the handle substrate with an overlying film of transfer material in the second state, which is substantially free from TDD;

9. Process the film of transfer material through one or more processing steps for the manufacture of integrated circuits; and 10. Perform other steps, as desired.

The above sequence of steps provides a method according to an embodiment of the present invention. As shown, the method uses a combination of steps including a way of forming an integrated circuit device on a stressed silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

A method of manufacturing strained silicon substrates is briefly outlined below.

1. Provide a donor substrate, e.g., silicon wafer, comprising an overlying film of transfer material characterized in a first state and having a face region;

2. Couple the film of transfer material comprising epitaxial silicon to a support member;

3. Attach the face region of the film of transfer material to the support member;

4. Remove the donor substrate from the film of material to expose a backside region and free the film of transfer material from the donor substrate while the film of transfer material remains affixed to the support member;

5. Process the film of material using the support member from the first state to a second state, which is characterized as a strained state;

6. Attach the backside region of the film of material in the second state, while being affixed to the support member, to a handle substrate;

7. Release the support member from the film of transfer material;

8. Provide the handle substrate with an overlying film of transfer material in the second state, which is substantially free from TDD; and 9. Perform other steps, as desired.

The above sequence of steps provides a method according to an embodiment of the present invention. As shown, the method uses a combination of steps including a way of forming stressed silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

Figure 2:
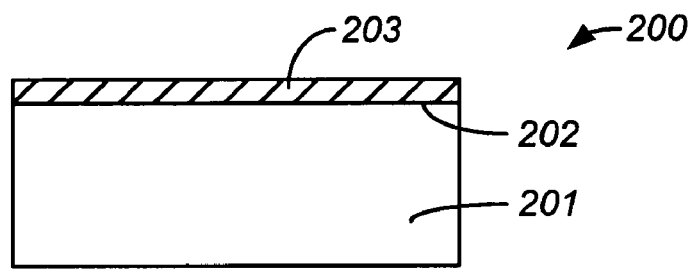
FIGS. 2 through 8 illustrate a method for fabricating a strained silicon substrate according to an embodiment of the present invention.

FIGS. 2 through 8 illustrate a method for forming integrated circuits according to an embodiment of the present invention. This diagram is merely an example, which should not unduly limit the scope of the claims herein. One of ordinary skill in the art would recognize other variations, modifications, and alternatives. As shown in FIG. 2, the present invention provides a method for fabricating multi-layered substrates. As shown, the method includes providing a donor substrate 200, e.g., silicon wafer. The donor substrate can also be made of other suitable materials, such as germanium (Ge), gallium arsenide (GaAs), or other Group IV, III-V and II-VI materials. The donor substrate can be laminated or homogeneous. In a specific embodiment, the substrate is a silicon on insulator 201 material. In a preferred embodiment, the donor substrate is as noted a silicon wafer made of single crystal silicon bearing material. Of course, there can be other variations, modifications, and alternatives.

As shown in FIG. 2, the donor substrate has an overlying film 203 of material characterized in a first state. The first state can be a relaxed state or a non-strained or stressed state. That is, the first state is not compressive or tensile or any combination of these. Alternatively, the first state can be in a compressed or tensile or a combination of these states, depending upon the embodiment. In a certain embodiment, the film of material comprises a material selected from silicon, germanium, gallium arsenide, carbon, Group IV materials, III-V materials, II-VI materials, and optically active materials. Preferably, the film of material is an epitaxial silicon layer, which may be doped or undoped.

Depending upon the embodiment, the film of material can be separated by a cleave and/or separation region 202, which will be used to release the film of material. In a specific embodiment, the region can be an implanted region including a hydrogen bearing material. The hydrogen bearing material is provided by an implantation and/or diffusion process according to a specific embodiment. The region can be formed using a technique derived from a cleaving process described in U.S. Pat. No. 6,013,563, in the name of Henley, et al., filed Jan. 11, 2000, commonly assigned, and hereby incorporated by references. Other examples of a cleave layer are those made by a process called Nanocleave™ process by Silicon Genesis Corporation of San Jose, Calif. Alternative processes can include those called ELTRAN™ by Canon Inc. of Japan or the SmartCut™ process by Soitec SA of France. Depending upon the embodiment, other processes can also be used.

Figure 3:
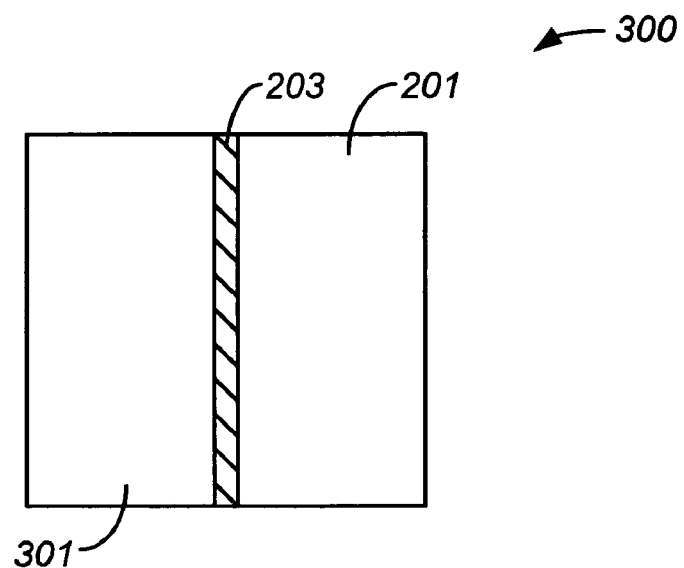
Figure 4:
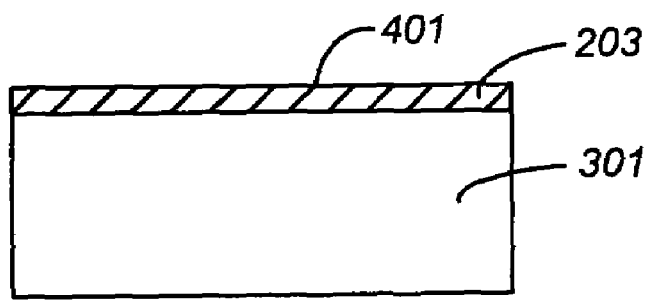
Figure 5:
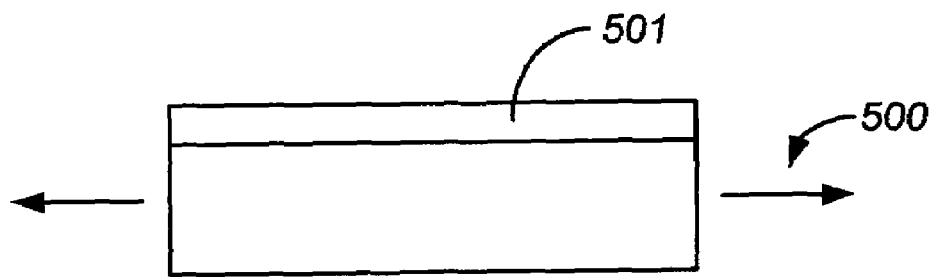

Referring to FIG. 3, the method includes coupling 300 the film of material to a support member 301 and attaching the face region of the film of material to the support member. The support member has at least two characteristics. That is, the support member supports the film of material and also processes the film of material to expand or contract the film in a desirable manner. Depending upon the application, the support material can include a mechanical block or thermal block. The support member can also be made of a plastic, ceramic, metal, glass, dielectric, a chemically reactive material, or a piezoelectric or other electrically modulated material, among others. Preferably, the support member holds the film of material before and after a strain process in a manner that is reversible. The support member holds the film of material using a compound that allows a release of the film onto the handle substrate. That is, the compound is still "sticky" enough that it allowed the film to be detached in the first place. In a specific embodiment, the compound can include a wax, a ultraviolet UV-type glue, etc. Alternatively, the support member uses an electrostatic chuck, a vacuum chuck, or the like to hold the film in place.

The method releases the donor substrate from the film of material 203 to expose a backside region 401. The method frees the film of material from the donor substrate while the film of material remains affixed to the support member. In a specific embodiment, the release method is a technique derived from a cleaving process described in U.S. Pat. No. 6,013,563, in the name of Henley, et al., filed Jan. 11, 2000, commonly assigned, and hereby incorporated by references. Other examples of a cleave layer are those made by a process called Nanocleave™ process by Silicon Genesis Corporation of San Jose, Calif. Alternative processes can include those called ELTRAN™ by Canon Inc. of Japan or the SmartCut™ process by Soitec SA of France. Depending upon the embodiment, other processes can also be used. Preferably, the thickness of material is still in the first state. The film of material is also defect free and has completely transferred onto the support member from the donor substrate. Depending upon the embodiment, portions of the film of material can also be attached to the support member. Of course, one of ordinary skill in the art would recognize other variations, modifications, and alternatives.

Figure 6:
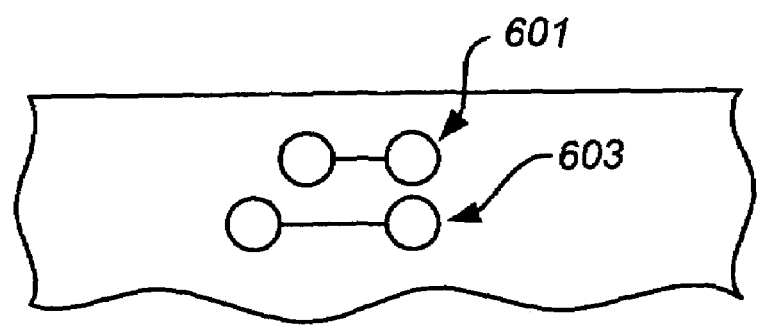

The method expands 500 the film of material 501 (which is in the expanded state) using the support member from the first state that is characterized by the relaxed state to a second state, which is characterized as a stressed state. Depending upon the type of support member, the method can use a variety of different ways to expand or contract the film of material. That is, the film of material can be expanded or contracted using thermal energy, electrical energy, mechanical energy, or chemical energy. The energy can be provided in a flood fashion or pulsed depending upon the embodiment. Referring to FIG. 6, the material is stretched from a first state 601 to a second state 603.

In a specific embodiment, the film of material is epitaxial silicon and/or single crystalline silicon from bulk silicon, as combinations of these materials. The epitaxial silicon has a thickness ranging from about 10 nm to about 200 nm but can be others. The silicon can be doped or undoped. The silicon becomes strained in a preferred embodiment. The strained silicon expands by about 0.5% and greater, depending upon the embodiment. The strained silicon is substantially crystalline and is free from any defects.

Figure 7:
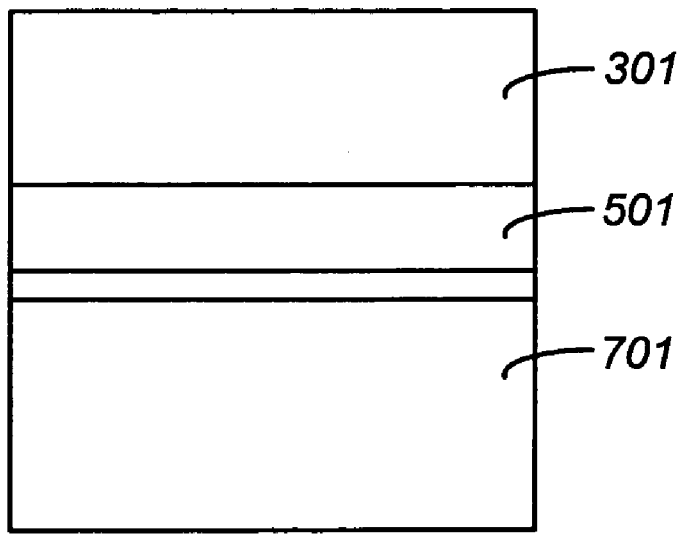

The method attaches the backside region of the film of material 501 in the second state, while being affixed to the support member, to a handle substrate 701 as illustrated by FIG. 7. The attachment can occur using a variety of techniques. For example, the attachment can occur using an insulating layer, a glue layer, a spin on glass layer, or other sticky layer with a sufficient initial and final bond strength and viscosity to keep the film 501 in the desired strained state. The film of material in the second state remains in the second state in preferred embodiments upon attachment to the handle substrate. In a specific embodiment, the attaching occurs using an initial bonding process, which is later finalized by annealing or other treatment method, depending upon the application.

Figure 8:
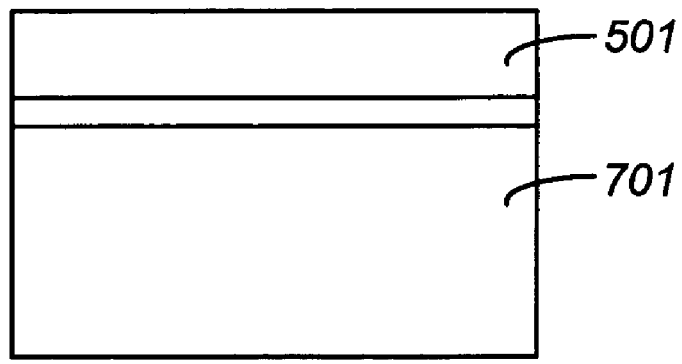

Referring to FIG. 8, the support member is released from the film of transfer material in the second state. The method provides the handle substrate comprising the film of material in the stressed state. The method includes processing one or more regions on the film of material in the stressed state. Examples of integrated circuit processing techniques are described in Silicon Processing Volume I, II, and III by Stanley Wolf (Lattice Press), which are incorporated by reference for all purposes.

In a preferred embodiment, the present invention includes a Strain-Developing-Substrate (SDS). The SDS has an ability to vary its lateral (in-plane, x-y) dimensions in response to thermal, electrical, mechanical, chemical, or other suitable input. In embodiments using thermal input, materials change their atomic spacing (e.g., isotropically—in all 3 dimensions x, y, z, or anisotropically—x,y vs z, or x vs y vs z) as the temperature is changed. The measure of this change is the coefficient of thermal expansion at a particular temperature. A suitable substrate using the thermal input concept has a high value of thermal expansion coefficient that allows for sufficient lateral atomic spacing change over a practical temperature range. For the electrical energy input, piezoelectric materials are an example. Here, applying different voltages on different parts of the material causes expansion or contraction of the material in lateral dimensions. The mechanical input can be realized by applying forces laterally to either stretch or contract the SDS in the lateral dimension. The chemical input approach can be realized, for example by a solid (SDS)-gas or solid (SDS)-liquid chemical reaction that results in the solid changing its volume. Another example would be absorption/removal of a gas or a liquid (like water) into/from the solid (SDS) bulk resulting in the solid changing volume. Yet another example would be the use of pressurized liquid or gas injection into a cavity within the SDS to generate a desired strain that is coupled to the thin-film 501.

These approaches allow for engineering the strain anisotropically in the x-y-plane e.g., by applying mechanical force along the x-axis, only atomic spacing along this axis will change (or change more than in the y dimension). If anisotropic strain is desired, the SDS can be engineered to allow for x-y plane strain asymmetries. For example, a piezoelectric SDS could be designed to allow separate and independent x and y axis strains to be applied. In some embodiments, both tensile and compressive strains can exist within the x-y plane (for example, x-axis may be tensile while the y-axis may be compressive).

Figure 9:
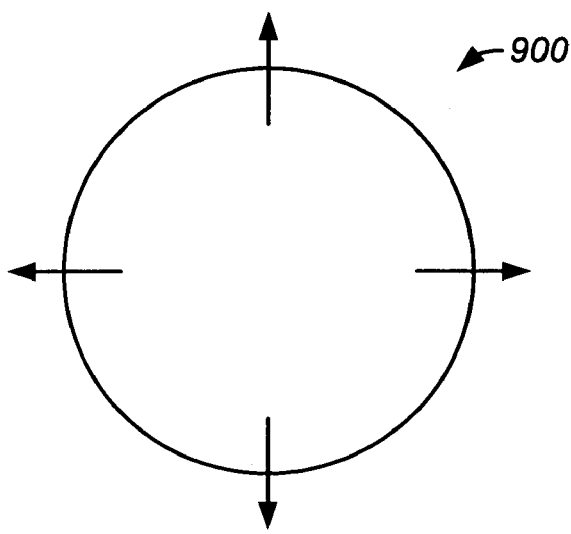
FIGS. 9, 10, and 11 are simplified top-view diagrams illustrating strained substrates according to embodiments of the present invention.
Figure 10:
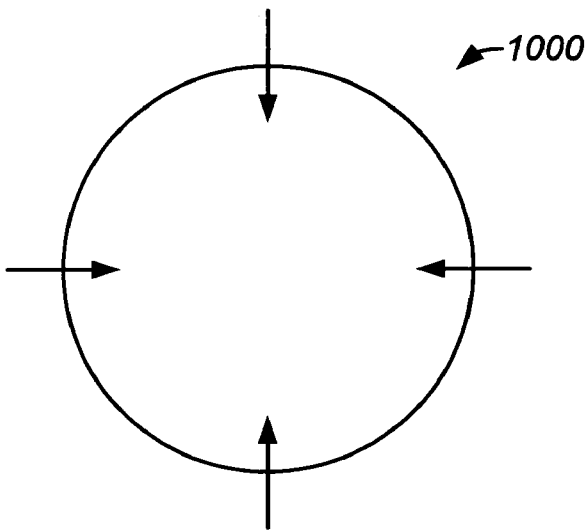
Figure 11:
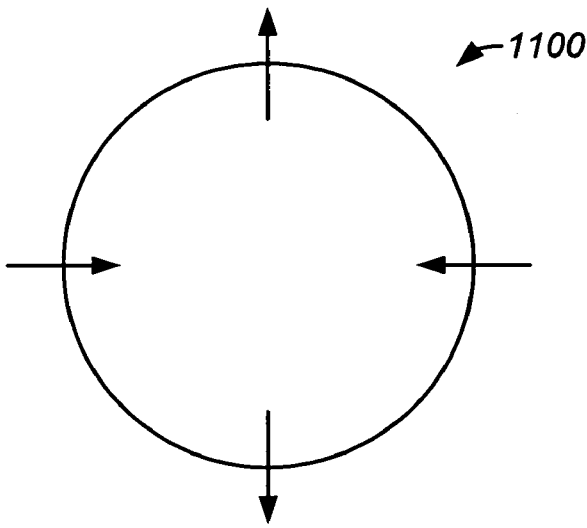

Examples of ways to strain substrates are illustrated by way of simplified top-view diagrams of FIGS. 9, 10, and 11. These examples are merely illustrations and should not unduly limit the scope of the claims herein. One of ordinary skill in the art would recognize many variations, modifications, and alternatives. These diagrams are top-view diagrams of a thickness of material that is subjected to selected strain or preferential strain according to embodiments of the present invention. As shown, the substrate 900 has been expanded (see arrows) using the support member, as illustrated by FIG. 9. The expansion occurs away from a center region of the substrate. Alternatively, substrate 1000 has been compressed (see arrows) toward a center region of the substrate. Alternatively, substrate 1100 includes portions that have been expanded and other portions that have been compressed (see arrows). Preferably, expansion occurs in one direction and compression occurs in another direction that is normal to the direction of compression.

Figure 12:
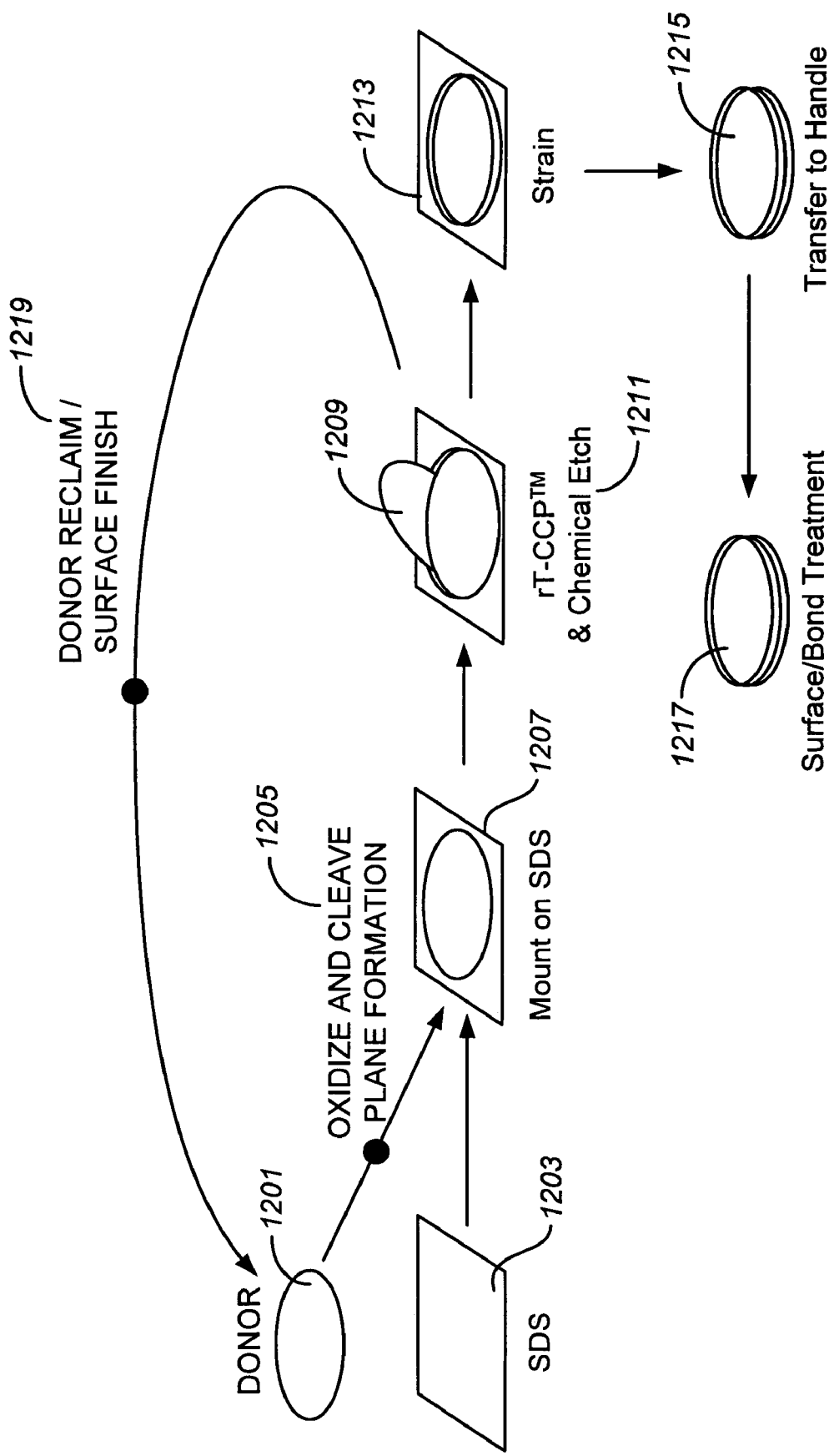
FIGS. 12 through 18 illustrate a method for fabricating a strained silicon substrate according to an alternative embodiment of the present invention.
Figure 13:
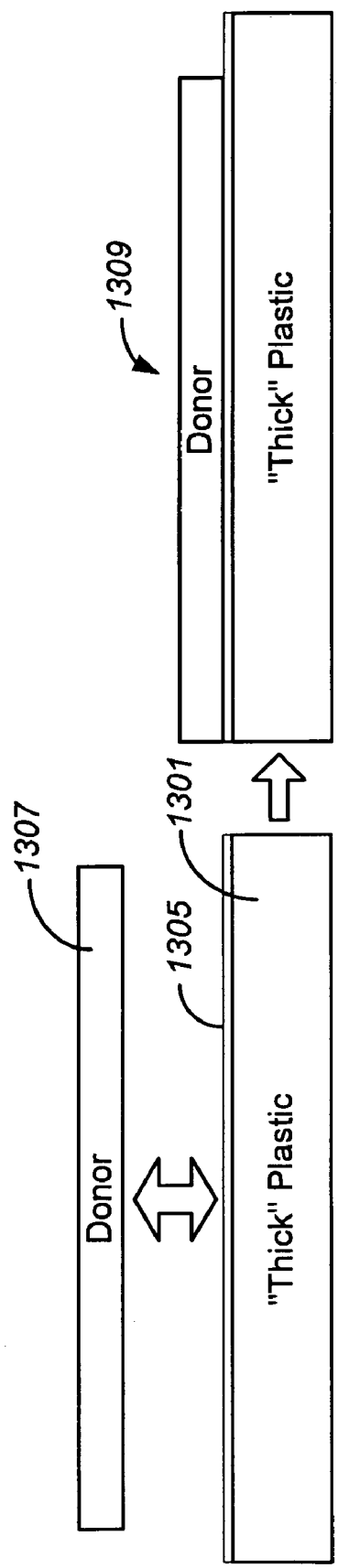

A method of manufacturing strained silicon substrates according to an alternative embodiment is briefly outlined below and also provided in the simplified flow diagram of FIG. 12.

1. Provide a donor substrate 1201, e.g., silicon wafer, comprising an overlying film of transfer material characterized in a first state and having a face region, a cleave plane 1205, and an oxidized surface region 1205;

2. Couple the film of transfer material to a support member, which is called SDS 1203 according to a specific embodiment;

3. Attach 1207 the face region of the film of transfer material to the support member;

4. Remove 1209 the donor substrate from the film of material to expose a backside region and free the film of transfer material using a controlled cleaving process from the donor substrate while the film of transfer material remains affixed to the support member;

5. Process 1211 the exposed surface of the film of material;

6. Process 1213 the film of material using the support member from the first state to a second state, which is characterized as a strained state;

7. Attach the backside region of the film of material in the second state, while being affixed to the support member, to a handle substrate;

8. Release the support member from the film of transfer material;

9. Bond 1215 the film of material in the second state to the handle substrate;

10. Provide the handle substrate with an overlying film of transfer material in the second state, which is substantially free from TDD;

11. Perform surface treatment 1217 on cleaved surface in the second state; and 12. Perform other steps, as desired.

The above sequence of steps provides a method according to an embodiment of the present invention. As shown, the method uses a combination of steps including a way of forming stressed silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 13 through 18 illustrate a method for fabricating a strained silicon substrate according to an alternative embodiment of the present invention. These diagrams are merely examples, which should not unduly limit the scope of the claims herein. One of ordinary skill in the art would recognize other variations, modifications, and alternatives. As shown, a donor substrate 1307 is coupled to a strain developing substrate 1301, called SDS herein. The strain developing substrate can be any suitable material that can be processed to provide a certain level of stain to a thickness of material from the donor substrate. The SDS has an ability to vary its lateral (in-plane, x-y) dimensions in response to thermal, electrical, mechanical, chemical, or other suitable input. In embodiments using thermal input, materials change their atomic spacing (e.g., isotropically—in all 3 dimensions x, y, z, or anisotropically—x,y vs z, or x vs y vs z) as the temperature is changed. The measure of this change is the coefficient of thermal expansion at a particular temperature. A suitable substrate using the thermal input concept has a high value of thermal expansion coefficient that allows for sufficient lateral atomic spacing change over a practical temperature range. For the electrical energy input, piezoelectric materials are an example. Here, applying different voltages on different parts of the material causes expansion or contraction of the material in lateral dimensions. The mechanical input can be realized by applying forces laterally to either stretch or contract the SDS in the lateral dimension. The chemical input approach can be realized, for example by a solid (SDS)-gas or solid (SDS)-liquid chemical reaction that results in the solid changing its volume. Another example would be absorption/removal of a gas or a liquid (like water) into/from the solid (SDS) bulk resulting in the solid changing volume. Yet another example would be the use of pressurized liquid or gas injection into a cavity within the SDS to generate a desired strain that is coupled to the thin-film 501. The strain developing substrate can be made of a metal, a semiconductor material, a plastic, an organic material, an insulating material, or any combination of these materials. Preferably, the stain developing substrate is a polymer material such as a thick plastic material, which holds the donor substrate in place 1309 via adhesive layer.

Preferably, the support member or SDS holds the film of material before and after a strain process in a manner that is reversible. The support member holds the film of material using a compound 1305 that allows a release of the film onto the handle substrate. That is, the compound is still "sticky" enough that it allowed the film to be detached in the first place. In a specific embodiment, the compound can include a wax, a ultraviolet UV-type glue, etc. Alternatively, the support member uses an electrostatic chuck, a vacuum chuck, or the like to hold the film in place.

Figure 14:
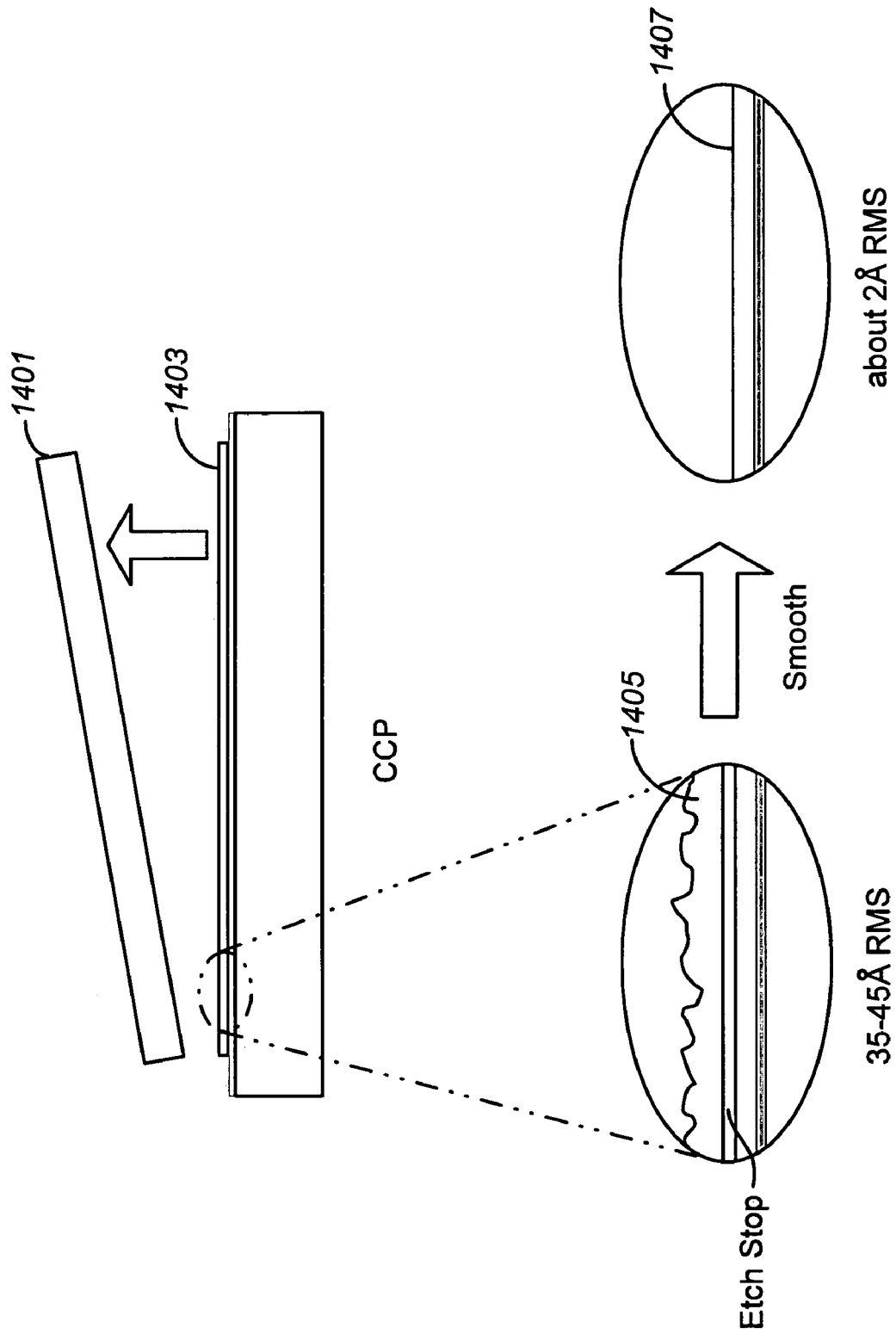

Referring to FIG. 14, the method removes a thickness of material 1403 from the donor substrate 1401. The method frees the film of material from the donor substrate while the film of material remains affixed to the support member. In a specific embodiment, the release method is a technique derived from a cleaving process described in U.S. Pat. No. 6,013,563, in the name of Henley, et al., filed Jan. 11, 2000, commonly assigned, and hereby incorporated by references. Other examples of a cleave layer are those made by a process called Nanocleave™ process by Silicon Genesis Corporation of San Jose, Calif. Alternative processes can include those called ELTRAN™ by Canon Inc. of Japan or the SmartCut™ process by Soitec SA of France. Depending upon the embodiment, other processes can also be used. Preferably, the thickness of material is still in the first state. The film of material is also defect free and has completely transferred onto the support member from the donor substrate. Depending upon the embodiment, portions of the film of material can also be attached to the support member. Of course, one of ordinary skill in the art would recognize other variations, modifications, and alternatives.

In a specific embodiment, the detached surface on the thickness of material is treated using a smoothing technique. The smoothing technique reduces a surface roughness of silicon bearing material from about 35 to 45 Angstroms RMS to less 1405 than 5 Angstroms RMS or more preferably about 2 Angstroms RMS and less 1407 in a specific embodiment. An example of a smoothing technique can use chemical etching using a HCl bearing species or any other etchant to selectively remove portions of the roughened region from the detached surface region. As will be noted, smoothing techniques to reduce the surface roughness of silicon bearing materials from 35 to 45 Å RMS to less than 5 Å can be achieved by various methods. In a specific embodiment, the smoothing technique can include CMP, or chemical mechanical polish. Others methods that can be used are a sequence and/or combination steps of oxidation, chemical etches and/or the use of gases to etch the surface according to other embodiments. Combinations of these processes can smooth the surface to the desired surface roughness of <5 Å according to a preferred embodiment. An oxidization cycle can be included at temperatures ranging from 800° C.-1000° C. with a combination of nitrogen, oxygen, and hydrogen gasses to yield an oxide layer, which upon stripping can smooth the silicon surface. In addition, if the cleave plane was generated using a silicon germanium buffer layer, a etch process to selectively remove the residual SiGe layer will lead to smoothing a rough surface. In a specific embodiment, etching occurs using a wet chemical etch process sequence using $H_2SO_4/H_2O_2$ for removing organic material, dilute HF, TMAH (tetramethyl ammonium hydroxide) for removing residual silicon, HHA (Hydrofluoric Acid-Hydrogen Peroxide-Acetic Acid) for selective etching of SiGe, SC1/SC2, and spin rinse dry operation. In yet an alternative embodiment, the method uses hydrogen chloride (HCl) gas to smooth the as-cleaved silicon wafer surface through an etch process. Such an HCl gas smoothing process may use an epitixal reactor manufactured by Applied Materials, Inc. of Santa Clara, Calif. Depending upon the embodiment, a temperature range of the process is from 1050° C. to 1200° C. in a gas mixture of HCL and H2 (See, for example, "Surface Finishing of Cleaved SOI Films Using Technologies" by AnnaLena Thilderkvist, Sien Kang, Martin Fuerfanger, and Igor Malik, presented at the IEEE SOI Symposium, Oct. 2-5, 2000). Of course, there can be other variations, modifications, and alternatives.

Figure 15:
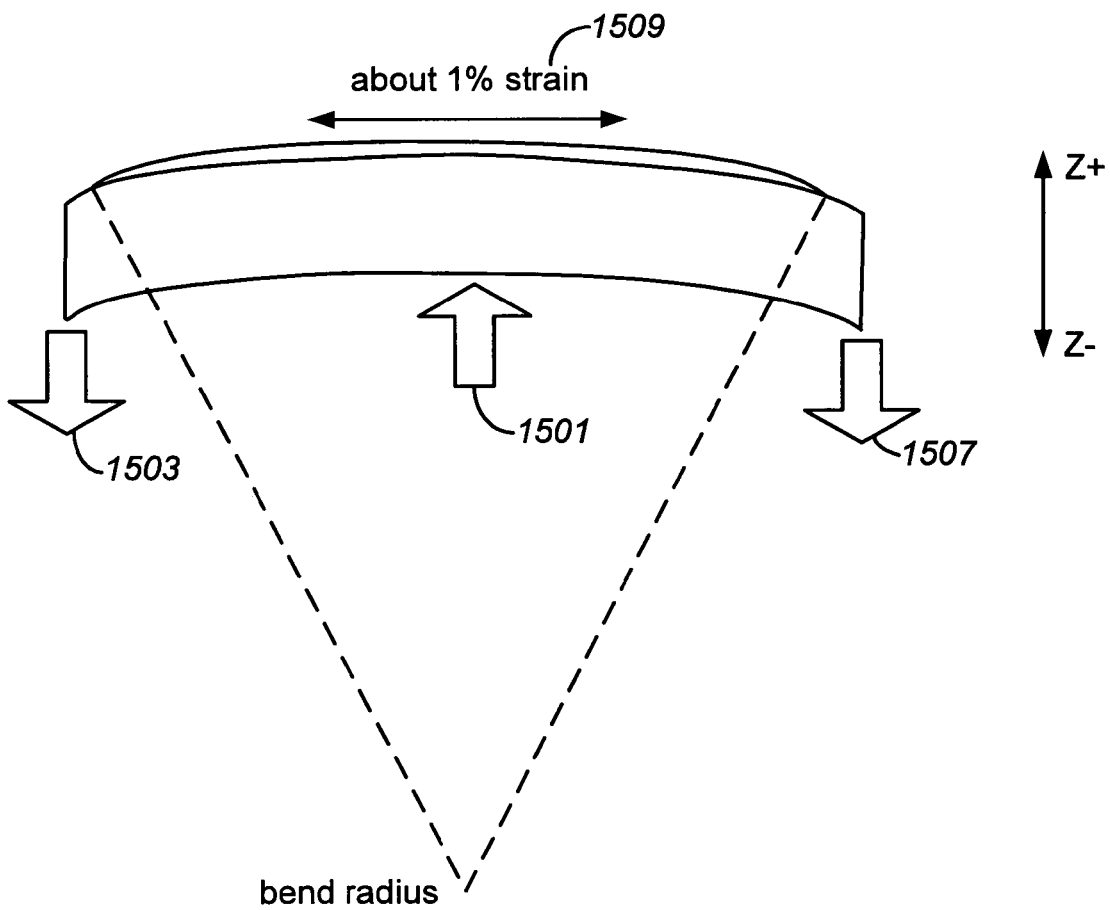

Referring now to FIG. 15, the method deflects the SDS, while the thickness of material is attached, to cause a strained thickness of material in a unilateral manner. That is, the strained thickness of material, using an example of single crystal silicon, is increased along a unilateral direction at about 1% or less or more depending upon the specific embodiment. The deflected SDS includes placing a positive force (see positive z-direction) in a normal direction within a center region of the SDS while placing negative forces along a periphery of the SDS such that the SDS forms an annular shape, which is generally semi-cylindrical, as illustrated. The cylindrical shape is about a certain bend radius as shown. In a specific embodiment, the bend radius ranges from about 24 centimeters to about 363 centimeters for a thickness of silicon bearing material of about 725 microns or less to cause a stain of about 35 to 507 Mega-Pascal and possibly greater. Of course, there can be other variations, modifications, and alternatives.

Figure 16:
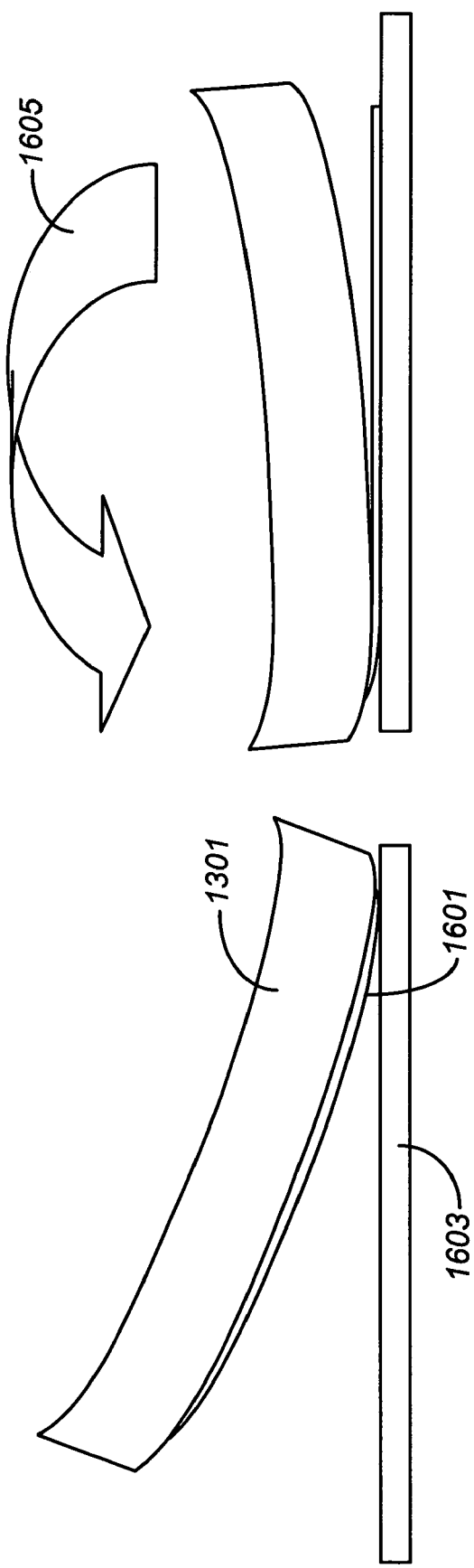

In a specific embodiment, the method transfers the thickness of material 1601, which has been strained, onto a handle substrate 1603, as illustrated by FIG. 16. As shown, the SDS is still in an annular or cylindrical configuration. The SDS, including the thickness of stained material, is transferred to the handle substrate using a rolling action. A first edge portion of the thickness of material mates with an edge region of the handle substrate, while other portions are free from any physical contact with the surfaces of the handle substrate. The SDS including the thickness of strained material rolls from the first edge portion, while the thickness of material attaches to the surface of the handle substrate, while detaching from the SDS, which temporarily held the thickness of material. As the SDS rolls from the first edge portion to the other edge portion the thickness of material, which is strained, detaches from the SDS while attaching to the handle substrate according to a specific embodiment. In a preferred embodiment, the thickness of strained material, which peels off of the SDS, is substantially attached to the handle substrate.

In a specific embodiment, the attachment between the thickness of material and the handle substrate can rely upon a variety of techniques. For example, such attachment may occur using a glue layer, a spin on glass layer, a silicon dioxide layer or other oxide layer, an adhesive (e.g., polymer), or any combination of these, depending upon the specific embodiment. Of course, there can be other variations, modifications, and alternatives.

Figure 17:

Referring to FIG. 17, the method subjects the bonded substrate structure, including the strained layer, to thermal treatment. In a specific embodiment, the thermal treatment permanently bonds the thickness of strained material to the handle substrate. The thermal treatment includes a furnace anneal and/or rapid thermal anneal, or the like, depending upon the specific embodiment. In a preferred embodiment, the method maintains the bonded substrate structure to a temperature of about 1150 Degrees Celsius to 250 Degrees Celsius for a period of time of about a few minutes to tens of hours.

Depending upon the specific embodiment, the method can also perform a smoothing process on the surface region of the strained thickness of material. The smoothing process can include chemical and thermal processes, as well as mechanical processes in a specific embodiment. In a specific embodiment, smoothing techniques to reduce the surface roughness of the strained thickness of material can be achieved by various methods. As merely an example, a method can be CMP (or chemical mechanical polish) according to certain embodiments. Others methods that can be used are a sequence and/or combination steps of oxidation, and/or the use of gases to etch the surface according to alternative embodiments. Certain combinations of these processes can smooth the surface to the desired surface roughness of <5 Å according to preferred embodiments An oxidization cycle can be performed at temperatures ranging from 800° C.-1000° C. with a combination of nitrogen, oxygen, and hydrogen gasses to yield an oxide layer, which upon stripping can smooth the silicon surface, according to other embodiments. In yet an alternative embodiment, the smoothing technique use hydrogen chloride (HCl) gas to smooth the as-cleaved silicon wafer surface through an etch process. An example of such an HCl smoothing process can be used on an epitixal reactor manufactured by Applied Materials, Inc. of Santa Clara, Calif. Depending upon the embodiment, a temperature range of the smoothing process can range from about 1050° C. to 1200° C. in a gas mixture of HCl and $H_2$ (See, for example, "Surface Finishing of Cleaved SOI Films Using Technologies," by AnnaLena Thilderkvist, Sien Kang, Martin Fuerfanger, and Igor Malik, presented at the IEEE SOI Symposium, Oct. 2-5, 2000). Of course, there can be variations, modifications, and alternatives.

Figure 18:
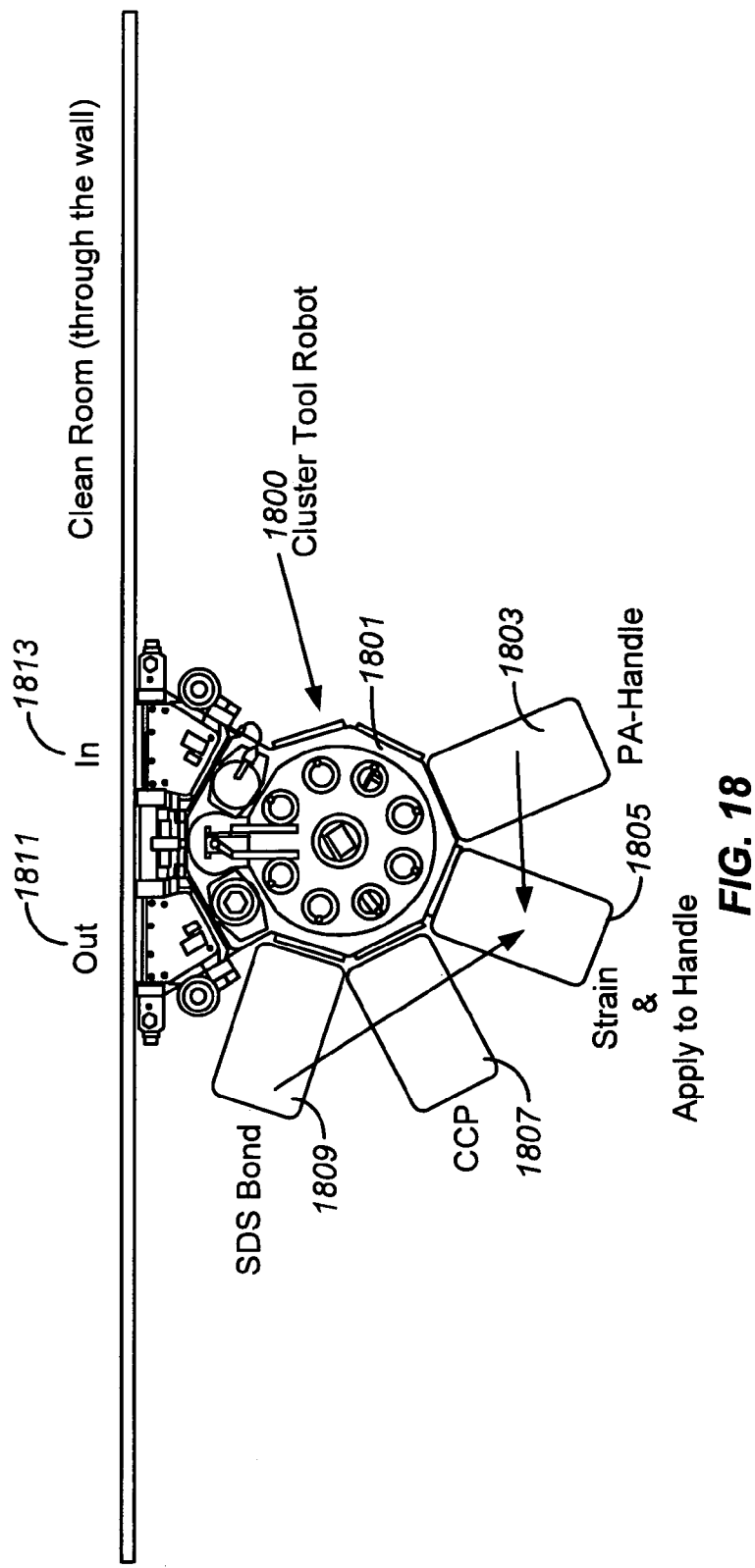

In yet an alternative embodiment, the present invention provides a cluster tool system for forming strained substrates, as illustrated by the simplified diagram of FIG. 18. In a specific embodiment, the system has a handling chamber 1801 coupled to a robot arm, which can transfer substrates among output chamber 1811, input chamber 1813, and a variety of processing chambers 1801, 1803, 1805, 1807, 1809. As shown, a strain developing chamber 1805 is coupled to the robot arm. In a preferred embodiment, the strain developing chamber has a strain developing substrate, which is adapted to form strain in a thickness of material using the strain developing substrate coupled to the thickness of material. The system also has a controlled cleaving chamber 1807 coupled to the handling chamber. The system has a bonding chamber 1809 coupled to the handling chamber. The system has a plasma activation chamber 1803 also coupled to the handling chamber. Of course, there can be other chambers coupled to the handling chamber in other embodiments. Additionally, certain chambers may be removed from the handling chamber according to other embodiments. An example of a handling chamber can be provided by a platform such as certain cluster tools manufactured by Applied Materials, Inc. of Santa Clara, Calif., USA or Tokyo Electron Ltd. of Japan. One of ordinary skill in the art would recognize other variations, modifications, and alternatives.

Figure 19:
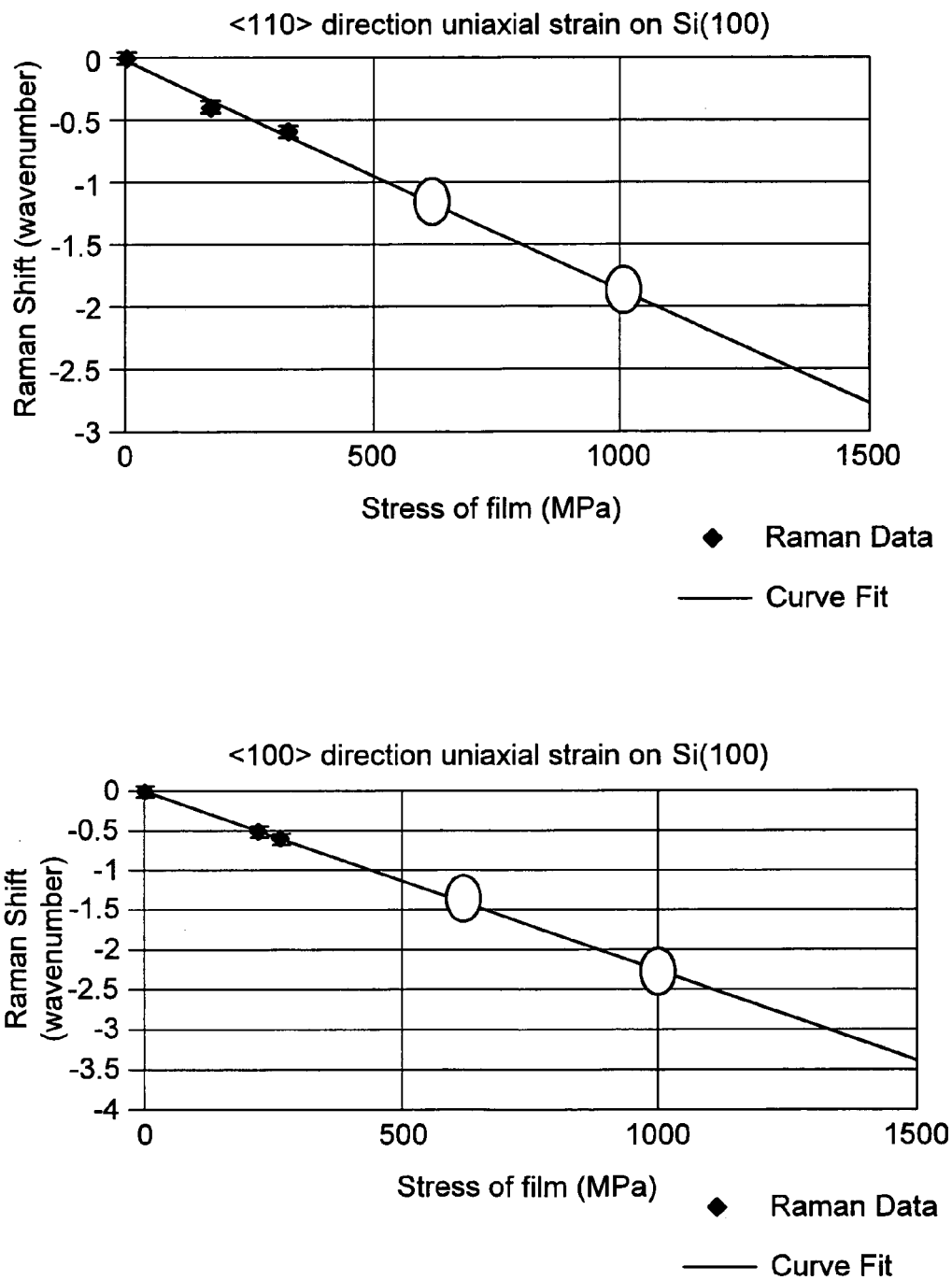

FIGS. 19 through 20 are experimental results according to embodiments of the present invention. These diagrams are merely examples, which should not unduly limit the scope of the claims herein. One of ordinary skill in the art would recognize other variations, modifications, and alternatives. As an example, FIG. 19 illustrates certain strained layers using experiments according to embodiments of the present invention. FIG. 20 illustrates experimental results of strain and surface profiles (e.g., roughness) of cleaved surfaces according to embodiments of the present invention. Of course, there can be other variations, modifications, and alternatives.

Depending upon the embodiment, the thickness of material can be made with selected portions that are compressed and other portions that are expanded. That is, certain portions are compressed and other portions are in tensile mode, as noted above. In a specific embodiment, MOS transistors including n-type channel and p-type channel are formed on certain portions of the substrate. Preferably, each of these devices are provided on a certain portion of the substrate to independently optimize performance of these devices. P-type channel transistor are formed on regions that have been compressed and n-type channel transistors are formed on regions that are strained, depending upon a specific embodiment. Of course, there can be other variations, modifications, and alternatives.

Figure 21:
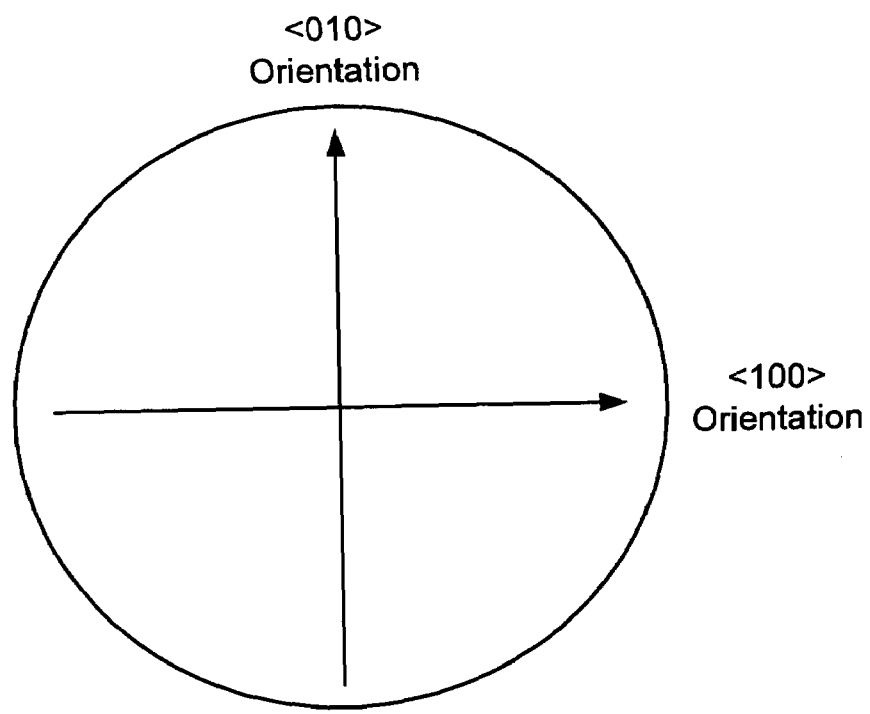
FIGS. 21 through 27 are simplified top-view diagrams of silicon substrates according to embodiments of the present invention.
Figure 22:
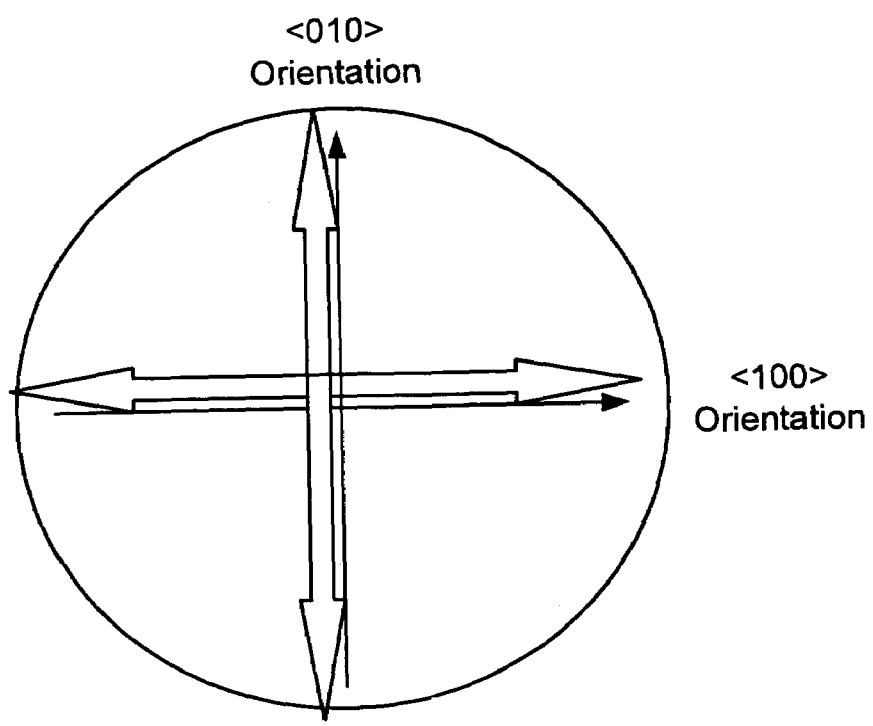
Figure 23:
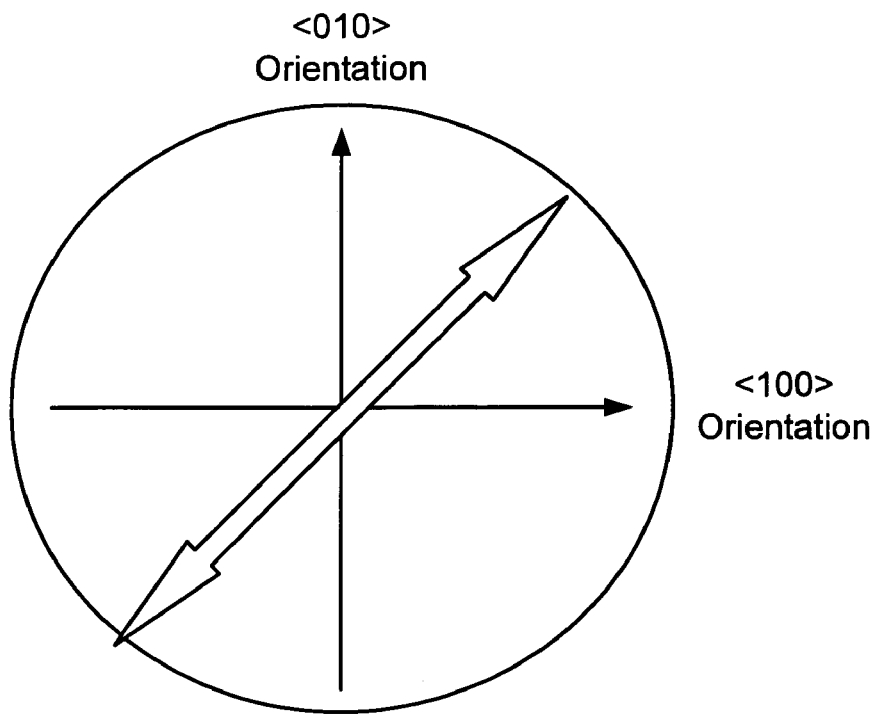
Figure 24:
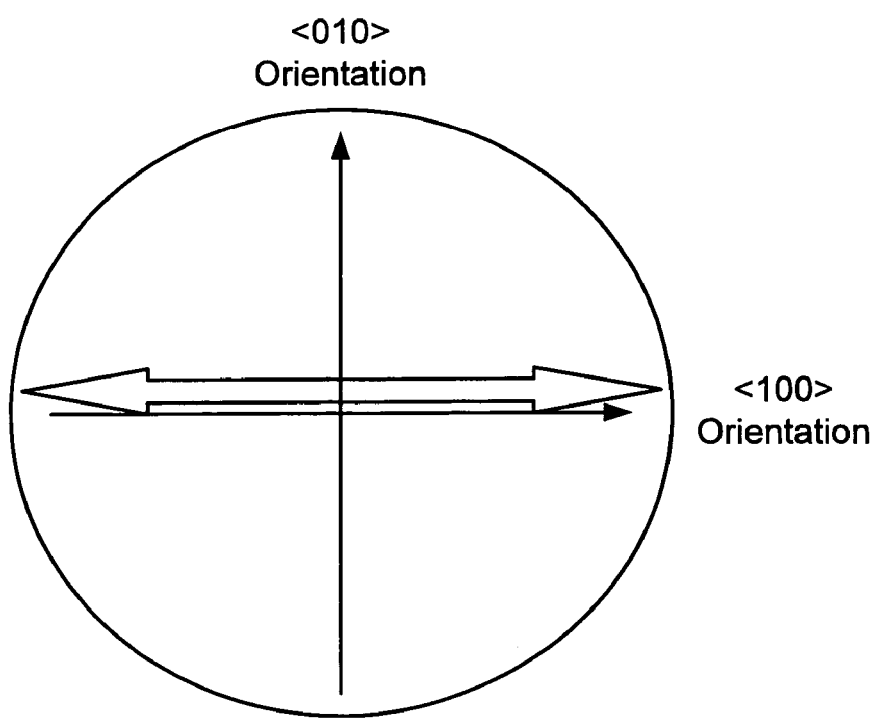
Figure 25:
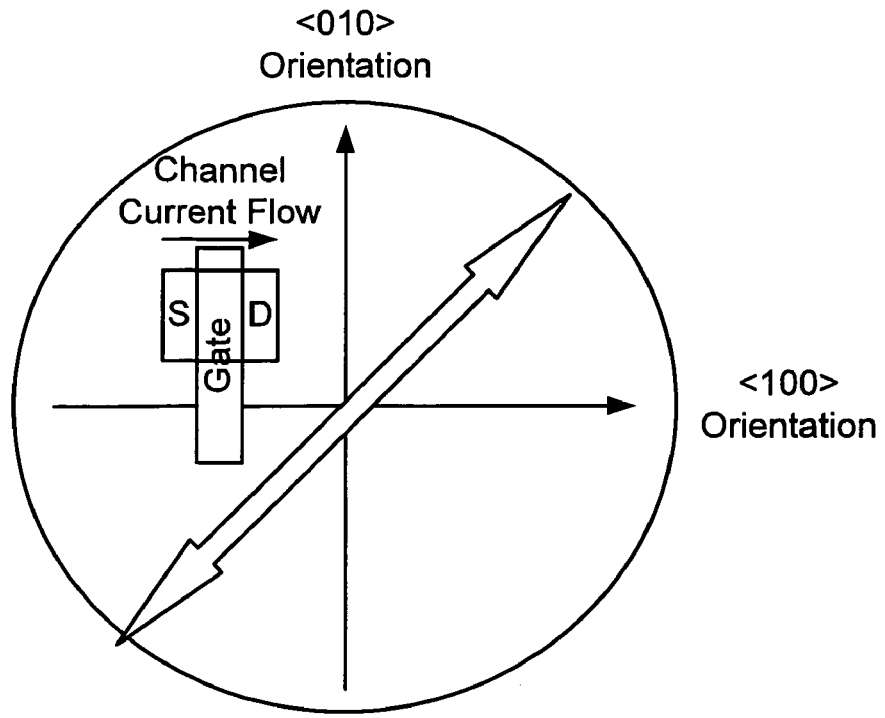
Figure 26:
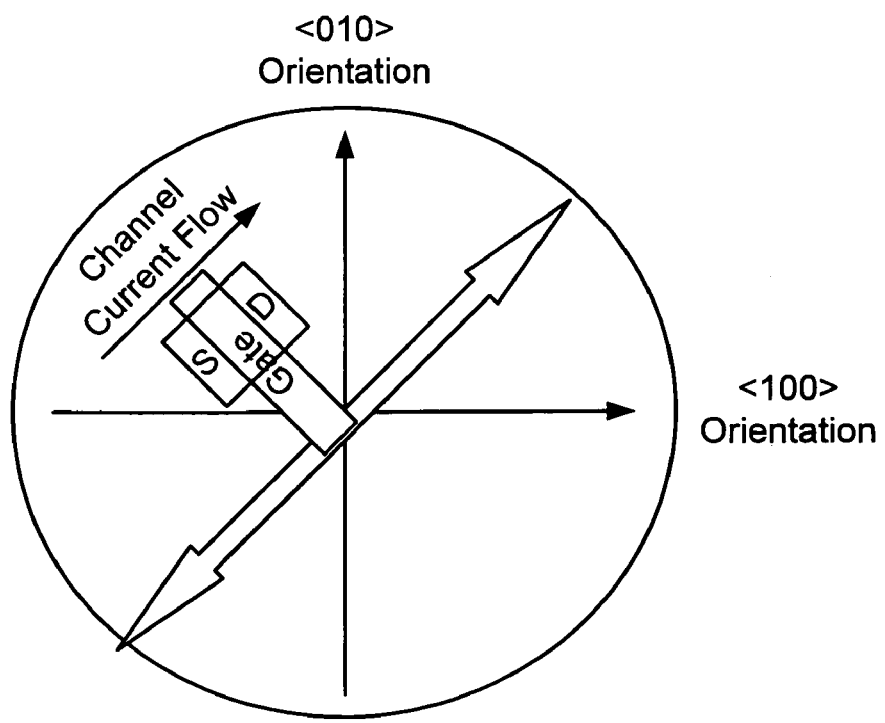
Figure 27:
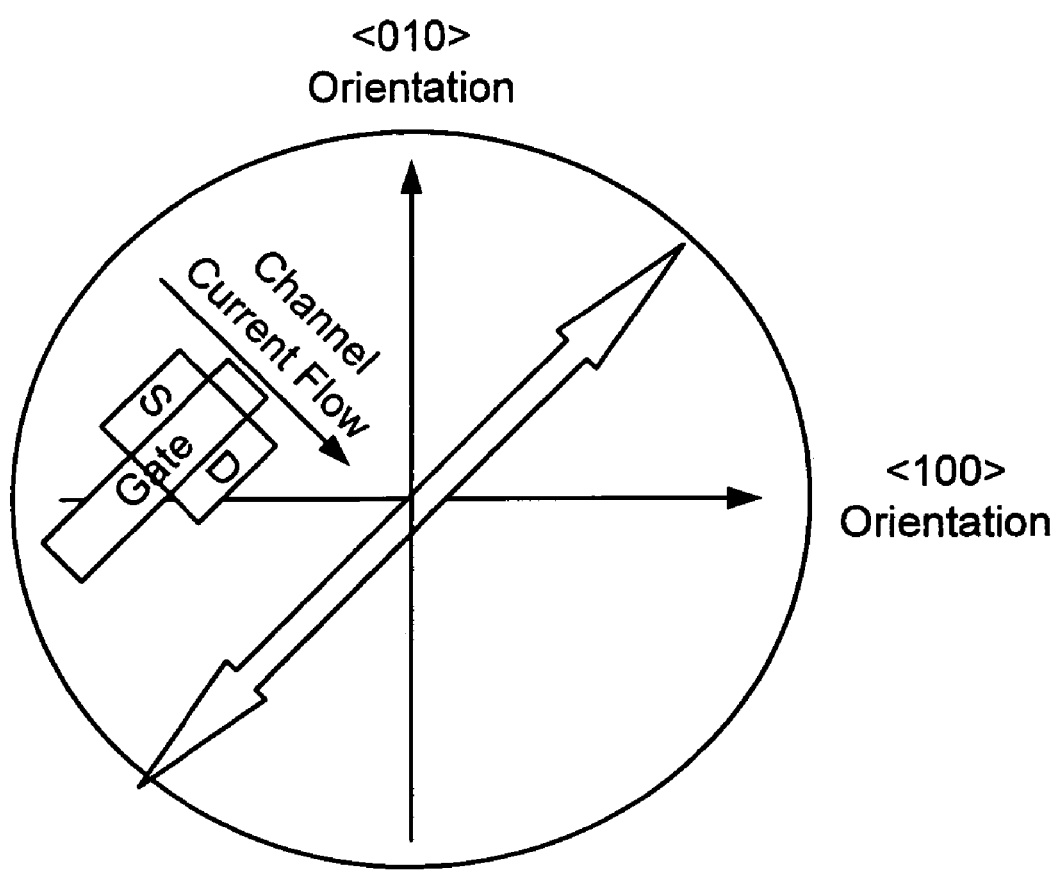

FIGS. 21-27 are examples of semiconductor substrates according to embodiments of the present invention. These examples illustrate certain types of substrates that have been described herein. As shown in FIG. 21, we have illustrated a top-view of a substrate having a <100> orientation without any strain. In FIG. 22, we have provided stain along the <100> and <010> orientations according to a specific embodiment, which form biaxial strain. As shown in FIG. 23, we have provided strain in the <110> orientation only to form an uniaxial stain embodiment. In yet an alternative embodiment, stain has been provided in the <100> orientation only to form yet another example of uniaxial stain, according to the simplified diagram of FIG. 24. Examples of MOS device orientations as associated with stain directions are provided in the simplified diagrams of FIGS. 25, 26, and 27. It will be noted, these are merely examples, which should not unduly limit the scope of the claims. One of ordinary skill in the art would recognize many variations, modifications, and alternatives.

Depending upon the embodiment, the present invention can be applied to a variety of substrate sizes and shapes. As an example, the substrates can be 4 inch, 5, inch, 6 inch, 8 inch, 12 inch and others. Additionally, the substrates can have an annular shape, such as a wafer, or a trapezoidal shape, depending upon the embodiment. Of course, there can be various modifications, alternatives, and variations.

The above described ways of achieving changes in lateral dimensions can be either reversible, or irreversible: reversible meaning that once the input is removed (SDS goes back to the original temperature, potential differences across SDS are removed, mechanical forces are not applied any more, chemical source is removed), the SDS reverts to its original (pre-input) dimensions; irreversible meaning that the SDS remains in dimensionally altered state (post-input) even after the input is removed.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating multi-layered substrates, the method comprising:
   providing a donor substrate comprising an overlying film of transfer material, the film of transfer material being characterized in a first state and having a face region;
   coupling the film of transfer material to a support member;
   attaching the face region of the film of transfer material to the support member;
   removing the donor substrate from the film of material to expose a backside region and free the film of transfer material from the donor substrate while the film of transfer material remains affixed to the support member;
   processing the film of material using the support member from the first state to a second state, the second state being characterized as a stressed state;
   attaching the backside region of the film of material in the second state, while being affixed to the support member, to a handle substrate; and
   releasing the support member from the film of transfer material to provide the handle substrate with an overlying film of transfer material.

2. The method of claim 1 wherein the first state is characterized as a relaxed state.

3. The method of claim 1 wherein the attaching the face region comprises a bonding process to bond the face region to the support member.

4. The method of claim 1 wherein the attaching the backside region comprises a bonding process to bond the backside region to the handle substrate.

5. The method of claim 1 wherein the film of transfer material is epitaxial silicon.

6. The method of claim 1 wherein the film of transfer material in the stressed state comprises epitaxial silicon.

7. The method of claim 1 wherein the donor substrate comprises a silicon on insulator substrate.

8. The method of claim 1 wherein the processing comprises expanding the film of material from the first state to the second state.

9. The method of claim 1 wherein the processing comprises compressing the film of material from the first state to the second state.

10. The method of claim 8 wherein the processing is provided by thermal energy, electrical energy, mechanical energy, or chemical energy.

11. The method of claim 9 wherein the processing is provided by thermal energy, electrical energy, mechanical energy, or chemical energy.

12. The method of claim 1 wherein the attaching the backside region with the handle substrate is provided using an oxide layer.

13. The method of claim 1 wherein the attaching the backside region with the handle substrate is provided using a glue layer.

14. The method of claim 1 wherein the attaching the backside region with the handle substrate is provided using a spin on glass layer.

15. The method of claim 1 wherein the film of transfer material comprises a material selected from silicon, germanium, gallium arsenide, carbon, III-V materials, II-VI materials, and optically active materials.

16. The method of claim 1 wherein the support member comprises a thermal block.

17. The method of claim 1 wherein the support member comprises a mechanical block.

18. The method of claim 1 wherein the support member comprises a plastic, ceramic, metal, glass, dielectric, a chemically reactive material, or a piezoelectric material.

19. A method for fabricating multi-layered substrates, the method comprising:
   providing a donor substrate comprising a thickness of a film of transfer material, the film of transfer material being characterized in a first state and having a face region;
   temporarily affixing the face region of the film of transfer material to a support member;

removing the donor substrate from the film of material to expose a backside region and free the film of transfer material from the donor substrate while the face region of the film of transfer material remains temporarily affixed to the support member;

processing the film of material using the support member from the first state to a second state, the second state being characterized as a stressed state;

attaching the backside region of the film of material in the second state, while being affixed to the support member, to a handle substrate; and releasing the support member from the film of transfer material to provide the handle substrate with an overlying film of transfer material.

20. The method of claim 19 wherein the processing comprises expanding the support member from a first state to a second state to cause the firm of material to be changed from the first state to the second state.

21. The method of claim 19 wherein the processing comprises bending the support substrate about a bend radius to cause the film of material to be changed from the first state to the second state.

22. The method of claim 21 wherein bending is about an axis parallel to a diameter region of the film of material.

23. The method of claim 19 wherein the attaching occurs by contacting an end region of the backside region of the film of material to a first portion of the handle substrate, while other portions of the backside region are free from contact to other portions of the handle substrate, to join the end region of the backside region to the first portion of the handle substrate and continuing to join the other portions of the handle substrate to the other portions of the film of material using a rolling action from the first portion of the film of material to other portions of the film of material.

24. A method for fabricating multi-layered substrates, the method comprising:

providing a donor substrate comprising an overlying film of material, the film of material being characterized in a relaxed state, the film of material having a face region;

coupling the film of material to a support member;

attaching the face region of the film of material to the support member;

releasing the donor substrate from the film of material to expose a backside region and free the film of material from the donor substrate while the film of material remains affixed to the support member;

expanding the film of material using the support member from the first state that is characterized by the relaxed state to a second state, the second state being characterized as a stressed state;

attaching the backside region of the film of material in the second state, while being affixed to the support member, to a handle substrate; and releasing the support member from the film of transfer material in the second state;

providing the handle substrate comprising the film of material in the stressed state; and processing one or more regions on the film of material in the stressed state.

25. The method of claim 24 wherein the donor substrate comprising a silicon on insulator substrate.

26. The method of claim 24 wherein the attaching the face region comprises a bonding process to bond the face region to the support member.

27. The method of claim 24 wherein the attaching the backside region comprises a bonding process to bond the backside region to the handle substrate.

28. The method of claim 24 wherein the film of material is epitaxial silicon.

29. The method of claim 24 wherein the film of material in the stressed state comprises epitaxial silicon.

30. The method of claim 24 wherein the donor substrate comprises a substrate on insulator substrate.

31. The method of claim 24 wherein the expanding is provided by thermal energy, electrical energy, mechanical energy, or chemical energy.

32. The method of claim 24 wherein the attaching the backside region with the handle substrate is provided using an oxide layer.

33. The method of claim 24 wherein the attaching the backside region with the handle substrate is provided using a glue layer.

34. The method of claim 24 wherein the attaching the backside region with the handle substrate is provided using a spin on glass layer.

35. The method of claim 24 wherein the film of material comprises a material selected from silicon, germanium, gallium arsenide, carbon, III-V materials, II-VI materials, and optically active materials.

36. The method of claim 24 wherein the support member comprises a thermal block.

37. The method of claim 24 wherein the support member comprises a mechanical block.

38. The method of claim 24 wherein the support member comprises a plastic, ceramic, metal, glass, dielectric, a chemically reactive material, or a piezoelectric material.

* * * * *